United States Patent [19]

Hazani

[11] Patent Number: 4,845,538
[45] Date of Patent: Jul. 4, 1989

[54] $E^2$ PROM CELL INCLUDING ISOLATED CONTROL DIFFUSION

[76] Inventor: Emanuel Hazani, 1210 Sesame Dr., Sunnyvale, Calif. 94087

[21] Appl. No.: 152,702

[22] Filed: Feb. 5, 1988

[51] Int. Cl.$^4$ ............... G11C 11/40; H01L 29/78; H01L 27/04
[52] U.S. Cl. .................... 357/23.5; 357/41; 357/45; 365/185
[58] Field of Search ............ 357/23.5, 41, 45; 365/185

[56] References Cited

U.S. PATENT DOCUMENTS

| | | | |
|---|---|---|---|
| 4,402,064 | 8/1983 | Arakawa | 357/23.5 |
| 4,442,447 | 4/1984 | Ipri et al. | 365/185 |
| 4,477,883 | 10/1984 | Wada | 357/23.5 |
| 4,513,397 | 4/1985 | Ipri et al. | 365/185 |
| 4,580,247 | 4/1986 | Adam | 365/185 |
| 4,628,487 | 12/1986 | Smayling | 357/23.5 |
| 4,663,740 | 5/1987 | Ebel | 357/23.5 |

Primary Examiner—William D. Larkins
Attorney, Agent, or Firm—Townsend and Townsend

[57] ABSTRACT

An improved $E^2$PROM cell including an isolated control diffusion region strongly capacitively coupled to the floating gate. This control region is coupled to the drain during programming and efficiently couples the programming voltage to the floating gate to induce tunnelling. Only three control signals are required to read, program, or erase the cell.

7 Claims, 4 Drawing Sheets

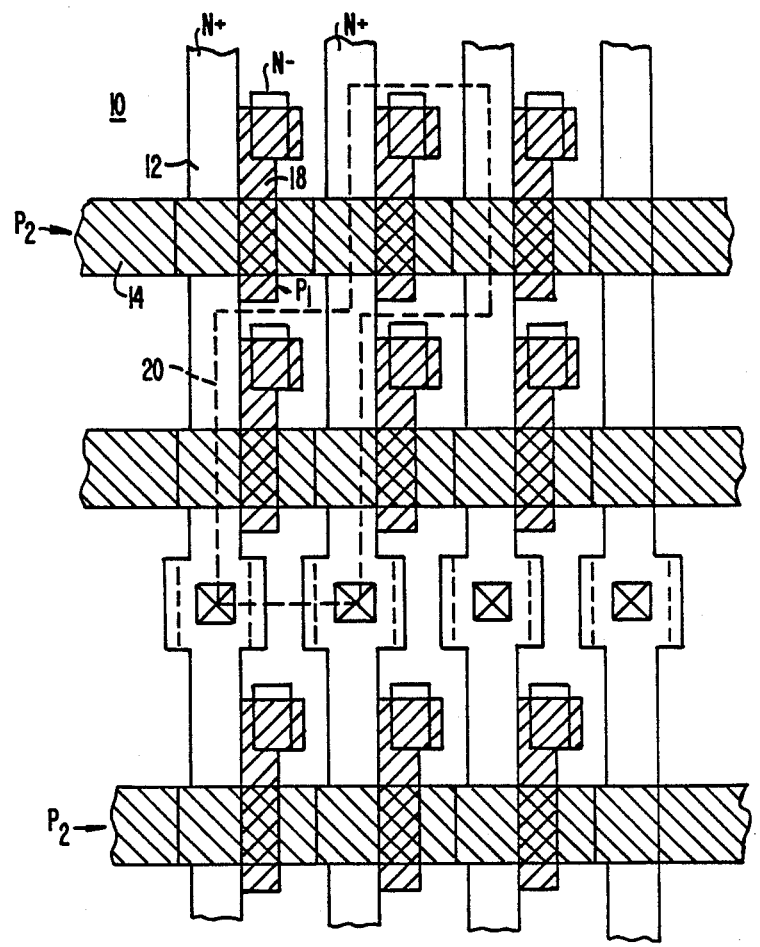
FIG._1.

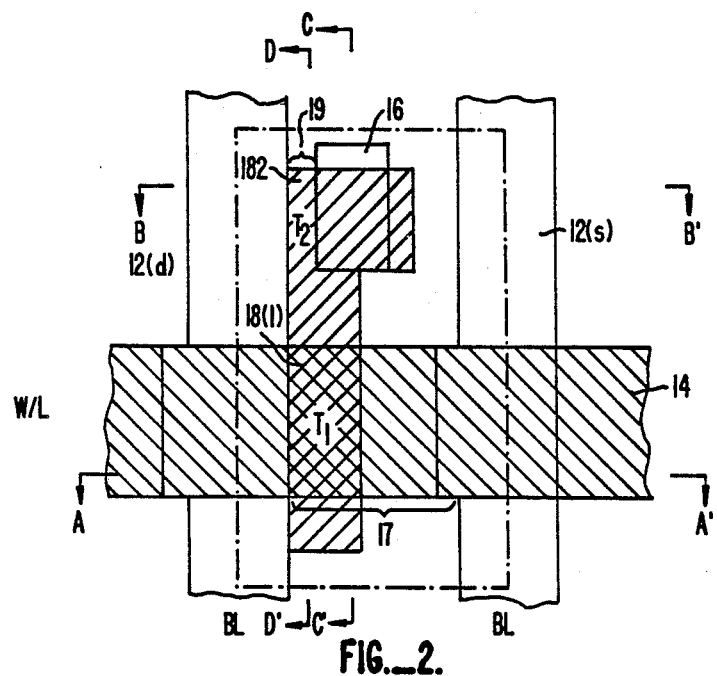
FIG._2.
FIG._3A. A-A' CUT
FIG._3B. B-B' CUT
FIG._3C. C-C' CUT
FIG._3D. D-D' CUT

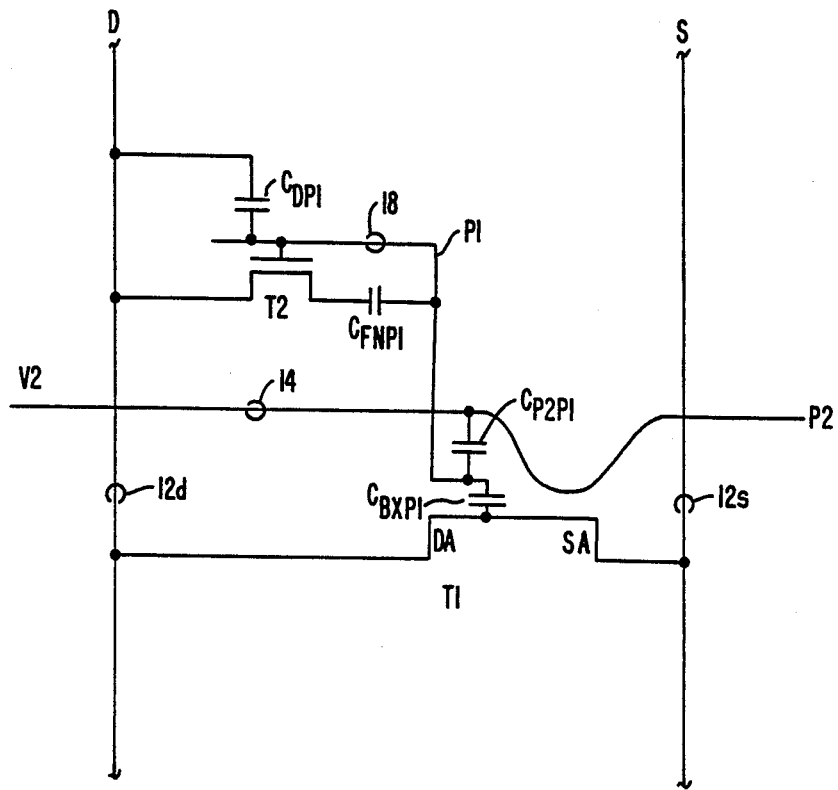
FIG._4.

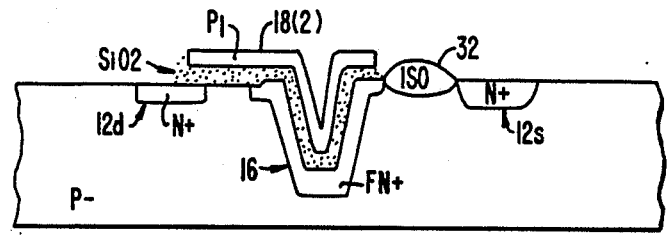
FIG._5.
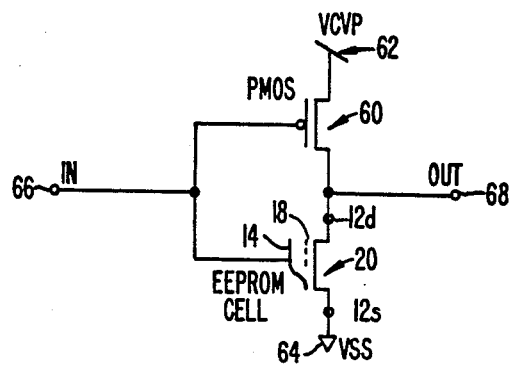
FIG._6.
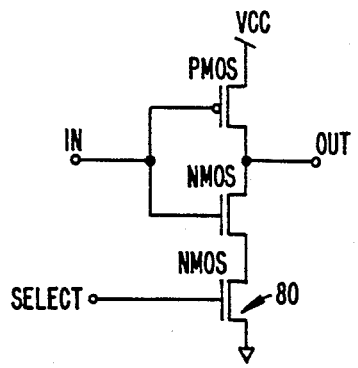
FIG._7.

$E^2$ PROM CELL INCLUDING ISOLATED CONTROL DIFFUSION

BACKGROUND OF THE INVENTION

1. Field of the Invention

The present invention relates generally to nonvolatile semiconductor read only memory (ROM) systems and, more particularly, relates to an improved electrically erasable programmable read only memory ($E^2$PROM).

2. Description of the Relevant Art

A great amount of research is being directed to improving $E^2$PROM memory systems. It is anticipated that these systems will eventually replace disk drives thereby substantially reducing the cost and read access time of storage in digital systems.

An $E^2$PROM cell is essentially an MOS transistor including source and drain diffusions coupled by a channel, a word line positioned over the channel, and a programmable floating gate positioned under the word line and above the channel. The cell stores a first binary state when the floating gate is charged with excess electrons and stores a second binary state when the floating gate is not charged with excess electrons.

During a read operation, the drain diffusion is charged to VD(R) and the word line is charged to VWL(R). If the floating gate is not charged, then the channel is inverted, current flows between the source and drain, and the voltage level of the drain diffusion decreases. This decrease is sensed to indicate that the second binary state is stored in the cell. If the floating gate is charged, then the threshold voltage of the MOS transistor is increased, the channel is not inverted, no current flows between the source and drain, and the voltage level of the drain diffusion does not decrease. This voltage level is sensed and indicates that the first binary state is stored in the cell.

Two methods utilized to charge the floating gate will now be described. The first method is to increase the potential difference between the source and drain diffusion to a level that induces avalanche breakdown at the drain junction. High energy electrons (hot electrons) will penetrate the oxide layer separating the floating gate from the channel and program the floating gate.

The second method is to cause electrons to tunnel from a grounded programming poly diffusion to the floating gate through a special tunnelling oxide layer. This tunnelling method requires three poly layers. The first layer is grounded and provides electrons during the charging operation, the second layer forms the floating gates, and the third layer forms the word lines. A select transistor must be included in each cell to allow discharging the floating gate of a single cell in a row.

The discharging of the floating gates will now be described. In the hot electron embodiment, the word line is charged to a relatively high erase voltage level VWL(E) and the floating gate is capacitively coupled to a grounded drain electrode through the isolation oxide. Electrons then tunnel from the floating gate to the word line through a tunnelling oxide layer. Similarly, in the tunnelling embodiment, the first poly layer is grounded and the second poly layer is coupled to ground via high capacitive ratio between the layers. The word line is charged to VWL(E) and electrons tunnel from the floating gate to the word line.

Both types of systems have advantages and drawbacks. Turning first to the hot electron type of system, the structure only requires two poly layers and is thus easier to fabricate. However, hot electrons transferred via the oxide damage the oxide thereby reducing the number of programming cycles. Additionally, the production of hot electrons requires an off-chip power source capable of generating significant current. Further, the weak coupling of the floating gate to ground requires that the magnitude of the erase voltage be high. When arranged in an array matrix, selective cells cannot be eased without the erasure of the entire array.

Turning next to the tunnelling system, the program and erase operations are less stressful to the oxide and more cycles are possible. Additionally, less current is drawn than in the hot electron system. However, during the erase operation extraneous electrons tunnel from the first poly to the word line and thus cause excess stress to the oxide and higher than necessary current flow. Further, the three poly layer structure is complex and requires four control signal contacts, i.e., source, drain, word line, and select.

In view of the above, it is apparent that an improved $E^2$PROM system facilitating the use of an on-chip power supply, utilizes only two poly layers, and provides for a high number of program cycles is greatly required.

SUMMARY OF THE INVENTION

The present invention is an improved $E^2$PROM cell that utilizes electron tunnelling from the word line to the floating gate and includes only first and second poly layers. Only three control signals are required to read, program, or erase the cell.

In a preferred embodiment, the cells are formed along the major surface of a P− doped semiconductor substrate and arranged in a rectangular array at the intersections of vertical bit line diffusions and horizontal poly word lines. Each cell includes a modified first MOS transistor including a first channel region, disposed below the word line, connecting the source and drain diffusion. This first MOS transistor has a stacked poly gate with a floating gate having a first region underlying the word line and overlying a drain area of the channel of the transistor. The channel also includes a source area over which the floating gate is not disposed. The state of the bit stored in the cell depends on whether the floating gate is charged.

Each cell also includes a control region that is geometrically isolated from the source and drain diffusions. A second region of the floating gate overlies this control region so that the floating gate is strongly capacitively coupled to the control diffusion region. Additionally, the second region of the floating gate overlies a second channel region of a second transistor coupling the drain diffusion and control diffusion region. Further, this second region of the floating gate is adapted to be capacitively coupled to the drain duffusion.

According to one aspect of the invention, a selected cell is programmed by charging its drain diffusion to a programming voltage level and grounding its word line. The voltage level on the floating gate increases, due to the capacitive coupling to the drain and drain area of the channel, to invert the second channel region and couple the control diffusion region to the drain. Thus the control region is charged to programming voltage and this voltage is strongly coupled to the floating gate by the floating gate/control region capacitance.

According to a still further aspect of the invention, a selected cell is erased by grounding its drain and charging its word line to an erase voltage. A sufficient potential difference is generated to cause electrons to tunnel from the floating gate to the word line. For unselected cells in the same column, the word lines and drain are grounded. This voltage prevents the generation of a potential difference to cause tunnelling from the floating gate to the word line. Accordingly, a single cell in a column may be erased.

In one embodiment, a single cell is utilized as a circuit element that functions as an NMOS transistor having a programmable threshold voltage level. The three NMOS transistor control signals, $V_S$, $V_D$, and $V_G$, are coupled to the source diffusion, drain diffusion, and P2 layer respectively.

For unselected cells in the same column, the wordlines are charged to an intermediate voltage to prevent the generation of sufficient potential difference to cause tunnelling from the word-lines to the floating gates. Accordingly, a single cell in a column may be erased.

The present cell causes very little stress to be placed on the oxide during the program and erase operations and can be reliably subjected to many such operations. As described above, tunnelling between the word line and floating gate is the least stressful method of programming and erasing. Further, extraneous current flow is eliminated due to the efficient geometry of the system.

Other features and advantages of the invention will become apparent in view of the drawings and following detailed description.

BRIEF DESCRIPTION OF THE DRAWINGS

FIG. 1 is a top view of a preferred embodiment of the array;

FIG. 2 is a top view of a preferred embodiment of a cell;

FIGS. 3A-3D are cross-sectional views of the cell depicted in FIG. 2;

FIG. 4 is a schematic diagram of an electrical model of the cell;

FIG. 5 depicts an alternative structure for $C_{FNP1}$

FIG. 6 depicts a CMOS circuit including the cell of the present invention; and

FIG. 7 depicts a standard configuration of the circuit of FIG. 6.

DETAILED DESCRIPTION OF THE PREFERRED EMBODIMENTS

FIG. 1 depicts the overall layout of the array of $E^2$-PROM memory cells. Referring now to FIG. 1, the array is laid out on the major surface 10 of a P− doped monocrystalline silicon substrate. A first set of equispaced, vertical N+ regions 12 form the source/drain lines of the array. These source/drain lines are crossed by a first set of equispaced, horizontal polysilicon word lines 14. A second set of rectangular N+ control regions 16 are disposed between the source/drain regions 12 and geometrically isolated therefrom. A second set of floating gate poly layers 18 each include a first region disposed below an associated word line 14 and a second region disposed over an associated control region 16.

The word lines 14 and floating gates 18 are formed from separate poly layers that are deposited over the substrate and then selectively etched. Because the floating gates 18 are partially disposed below the word line 14, the layer utilized to form the floating gates is deposited first and the floating gates are referred to as poly 1 or P1. Similarly, the word lines are often referred to as poly 2 or P2. This terminology is utilized herein. A basic memory cell 20 is defined at the intersection of each source/drain line 12 and word line 14. The structure of the cell will now be described with reference to FIGS. 2 and 3A-3D.

In FIG. 2, the basic cell 20 is depicted with the drain line 12d positioned at the left and the source line 12s positioned at the right. Note that the line 12d functions as the source for the cell 20(1) disposed to the left of the cell depicted and the line 12s functions as the drain for the cell 20(r) disposed to the right of the cell depicted.

In FIG. 2, two transistors, T1 and T2, are depicted with both transistors having drain line 12d as their drains. Transistor T1 has the source line as its source, a first channel region 17 of the major surface underlying the word line 14 as its channel, and a stacked gate structure including the first region 18(1) of the floating gate 18 and the word line 14 as its control electrode. Transistor T2 has the control region 16 as its source, a second region 18(2) of the floating gate 18 as its gate, and a second channel region 19 of the major surface 10 disposed between the control region 16 and drain line 12d as its channel.

FIGS. 3A-3D are cross-sectional views taken along the cuts A-A', B-B', C-C', and D-D', respectively, of FIG. 2. FIG. 3A is a cross-sectional view of transistor T1. In FIG. 3A, the channel 17 of T1 includes a drain area DA disposed adjacent to the drain line 12d and below the first region 18(1) of the floating gate 18 and a source area SA disposed adjacent to the source line 12s and beneath the section of the word line 14 that does not overlay the floating gate 18.

During the program and erase operations electrons tunnel through the oxide layer 31 separating the first region 18(1) of the floating gate 18 and the word line 14. Generally, when a poly layer is deposited, the upper surface has small convex disks dispose thereon and the lower layer has small concave cups disposed thereon. It is well-known that the forward threshold required to induce tunnelling from a lower poly layer to an upper poly layer is lower than the reverse threshold voltage required to induce tunnelling from the upper poly layer to the lower layer.

FIG. 3B is a cross-sectional view of the transistor T2. A boundary of the floating gate 18 is adjacent to the drain line 12d and almost completely overlies the control region 16. The control region 16 and source line 12s are isolated by a field oxide region 32. FIGS. 3C and 3D depict the isolation of the N+ regions and channel regions by the field oxide layers.

FIG. 4 is an electrical schematic diagram illustrating the capacitive coupling of the floating gate P1 18 to the drain line 12d ($C_{DP1}$), to the word line (P2) 14 ($C_{P2P1}$), to the control diffusion 16 ($C_{FNP1}$), and to the bulk semiconductor ($C_{BKP1}$). The magnitude of these capacitances is determined by the area of overlap between P1 and the various circuit elements and the thickness of the oxide layer separating the structures.

In FIG. 4, the upper and lower plates of $C_{DP1}$ are, respectively, the adjacent sections of the drain line 12d and the left edge of the floating gate 18. The left and right plates of $C_{FNP1}$ are, respectively, the control region 16 and the section of the second region 18(2) overlying the control region. This coupling is much stronger than the drain/floating gate coupling because of the large overlap and the thinner oxide thickness. The upper and lower plates of $C_{P2P1}$ are, respectively, the overlapping regions of the word line 14 and first region 18(1). Finally, the lower and upper plates of $C_{BKP1}$ are, respectively, the bulk area of the channel of T1 and the first region 18(1) of the floating gate.

The following equation expresses the floating gate voltage ($V_{P1}$) in terms of the above-described capacitances, the charge ($Q_{P1}$) on the floating gate, and the voltage levels on the wordline ($V_{P2}$), the control electrode ($V_{FN}$), the drain ($V_D$), and the bulk semiconductor substrate ($V_{BK}$):

$$V_{P1} = \frac{(-Q_{P1}) + [V_{P2}C_{P2P1} + V_{FN}C_{P1FN} + V_DC_{DP1} + V_BC_{BKP1}]}{C_{P2P1} + C_{FNP1} + C_{DP1} + C_{BKP1}} \quad \text{Eq. 1}$$

The program and erase operations will now be described for an embodiment having the dimensions shown on FIG. 2 and having the following oxide thicknesses:

$T_{P2P1} = 600$ angstroms
$T_{FNP1} = 250$ angstroms
$T_{DP1} = 400$ angstroms
$T_{DAP1} = 400$ angstroms For this embodiment the forward tunnelling threshold voltage level is about 8 volts, the reverse tunnelling threshold voltage level is about 12 volts, and the threshold voltage of T1 and T2 is about 0.8 volts.

Table 1 lists the voltages on the drain 12d, source 12s, and word lines 14 for programming a selected cell to store the first binary state (floating gate charged) and the same voltage states for all unselected cells. Table 1 also list the value of the current ($I_{DS}$) that flows from source to drain in T1. It is critical that unselected cells not be programmed by tunneling, or have a parasitic $I_{DS}$ current that might cause hot electron programming.

TABLE 1

|  | $V_D$ | $V_S$ | $V_{P2}$ | IDS |
|---|---|---|---|---|
| Selected | 15 | 8 | 0 | 0 |
| Unselected On Same Row | 8 | 8 | 0 | 0 |
| Unselected On Same Columns | 15 | 8 | 8 | 0 |

The programming of the selected cell will now be described with reference to Table 1 and FIG. 4. The drain voltage, $V_D$, is coupled to the floating gate 8 by $C_{DP1}$ and the voltage on the floating gate rises to about 2 volts which is higher then the $V_T$ of $T_1$. Thus the drain area DA of the channel is inverted and acts as an additional capacitor plate to couple the drain voltage to $P_1$. This capacitor is actually $C_{BKP1}$ in FIG. 4. The source area SA of the channel is not depleted because T1 is off due to the fact that WL 14 is held at OV. The coupling via $C_{BKP1}$ brings the potential of $P_1$ to above 2 volts and is sufficient to invert and deplete the channel of T2. Thus T2 is turned on to charge the lower plate (the control region 16) of $C_{FNP1}$ to $V_D$ minus the $V_T$ of T2 (0.8V).

This voltage on the control electrode is strongly coupled to the floating gate by $C_{FNP1}$. Accordingly, the voltage levels $V_{FN}$ and $V_B$ in equation 1 are equal to $V_D$–$V_{T2}$ and 15V respectively. Substitution of these values into equation 1 with $Q_{P1}=0$ (floating gate not charged) and $V_{P2}=$ (word line at ground) indicates that the magnitude of $V_{P1}$ is greater than 12 volts. Because P2 is grounded, this voltage on P1 is applied across the electrodes of $C_{P1P2}$ and exceeds the reverse threshold voltage of the oxide layer so electrons tunnel from P2 to P1.

For unselected cells in the same row, $V_D$ is 8 volts and $V_{P1}$ is about 6 volts. This voltage difference is insufficient to cause reverse tunnelling. For unselected cells in the same column, the potential of the word lines 14 is at 8V, thus the potential difference between the floating gates 18 to the control gates 14 is about 5 volts, which is below the reverse or forward tunneling threshold. Thus these cells will not program undesirably due to tunnelling of electrons. In addition $V_{GS}$ of T1 is 0 volts, because $V_{P2}$ is 0 volts and SA is not depleted, so that no $I_{DS}$ exists. Thus accidental hot electron programming will not occur. Accordingly, the present system provides for programming a single cell utilizing only three control signals, $V_D$, $V_S$, and $V_{P2}$.

Thus, the coupling between the drain 12d and the floating gate 18 is sufficient to turn on T2 which, in turn, facilitates charging the control region 16 to almost the full programming voltage. From eq. 1, this high value of $V_{FN}$ multiplied by the large value of $C_{FNP1}$ results in a high value of $V_{P1}$ and facilitates the use of lower programming voltage. Additionally, very little current is drawn because the floating gate is charged by the tunnelling mechanism.

Table 2 lists the voltage levels on the drain, source, and word lines for erasing (discharging) a selected cell to erase the first binary state (floating gate charged) and the values of these voltage levels for all unselected cells. It is critical that unselected cells on the same column and different rows not be erased.

TABLE 2

|  | $V_D$ | $V_S$ | $V_{P2}$ |
|---|---|---|---|
| Selected | 0 | 0 | 15 |
| Unselected in same column | 0 | 0 | 0 |

For the selected cell, $V_D$ is at ground and $V_{P2}$ is 15 volts. In this case, equation 1 indicates that the potential difference across $C_{P2P1}$ is greater than the forward tunnelling voltage so electrons tunnel from the floating gate to the word line to erase (discharge) the floating gate. For unselected cells in the same column $V_{P2}$ is 0 volts. In this case equation 1 indicates that the potential difference across $C_{P2P1}$ is not sufficient to cause forward tunnelling across the oxide layer. Accordingly, a single cell in a column may be erased.

An alternative structure for $C_{FNP1}$ is depicted in FIG. 5. The layout of cell 20 is as depicted in FIG. 2, however, the structure along cut B-B' is as depicted in FIG. 5 instead of FIG. 2A.

Referring now to FIG. 5, the control region 16 and second region 18(2) of the floating gate are implemented as a trench structure.

The process for forming this structure is well known and is utilized in the fabrication of Megabit DRAMs. The advantages of utilizing this structure are twofold. First, the footprint of the $C_{FNP1}$ will decrease thereby reducing the area of the cell 20. Secondly, the magnitude of $C_{FNP1}$ will increase because the trench structure provides for more overlap between the layers.

Because the present cell requires only three control signals, $V_D$, $V_S$, and $V_{P1}$, it operation is analogous to a standard NMOS transistor with $V_G = V_{P1}$. However, the present cell has the additional advantage of having a programmable threshold voltage. Accordingly, the cell may be advantageously incorporated into NMOS or CMOS logic arrays, gate-arrays, and other forms of programmable logic.

If the cell is utilized as a discrete circuit element then the long source and drain diffusions 12s and 12d of FIG. 2 are replaced by isolated source and drain diffusion regions and the word line 14 is replaced by an isolated control gate.

FIG. 6 is a circuit diagram of a CMOS invertor having a high-impedance output capability. Referring to FIG. 6, a PMOS transistor 60 has its source terminal coupled to a $V_C V_P$ input terminal 62 and its drain terminal coupled to the drain diffusion 12d of present cell 20. The source diffusion 12s of the cell 20 is coupled to a $V_{SS}$ terminal 64. The P2 layer 14 of cell 20 and the gate of the PMOS transistor 60 are coupled to an input terminal 66. An output terminal 68 is connected to the coupled drain terminals.

In normal operation the floating gate of the cell 20 is not charged and the threshold voltage of the cell 20 is less than 5 volts. Accordingly, when $V_{in}=5$ volts the cell 20 conducts and the PMOS transistor 60 is off so that $V_{SS}$ is coupled to the output terminal 68 thereby inverting the input signal. When $V_{in}=0$ volts, the PMOS transistor 60 is on, the cell 20 does not conduct and $V_C V_P$ is coupled to the output terminal 68 thereby inverting the input.

To convert to the high impedance mode the floating gate 18 of the cell is charged to increase the threshold voltage of the cell to greater than 5 volts and $V_{in}$ is set to 5 volts. Thus, both the cell 20 and the PMOS transistor 60 are nonconducting thereby isolating the output terminal 68 from the input terminal 60, the $V_C V_P$ terminal 62, and the $V_{SS}$ terminal 64.

This circuit is particularly useful when the output terminals of several invertor circuits are coupled to a signal bus and it is desired to transfer information from only one of the invertors to the bus. The cells in the non-selected invertor circuits are programmed and the input voltage in held at 5 volts.

The programming or erase operations are as described above. To program the cell 20 in the circuit of FIG. 6, $V_{in}$ is set to 0 volts and $V_C V_P$ set to 15 volts. The drain 12d of the cell 20 goes to 15 volts because the PMOS transistor 60 is on. Additionally, since the source 12s and P2 layer are both at 0 volts no current flows through the cell 20. Under these bias conditions, the floating gate 18 is charged and the cell 20 is programmed to a high threshold voltage. To erase a programmed cell 20, $V_{in}$ is pulled to 15 volts and $V_C V_P$ is set at 5 volts. In this case, the PMOS transistor 60 is off and the output terminal 68 is coupled to the $V_{SS}$ terminal 64 through the cell 20. Under these conditions the floating gate 18 will discharge FIG. 7 is a circuit diagram of a standard CMOS circuit for implementing a CMOS invertor with a high-impedance output feature. An extra select transistor 80 is required. If the SELECT signal is low then the output is isolated and if the SELECT signal is high the circuit functions as an invertor. Several advantages of the circuit utilizing the present cell 20 (FIG. 6) are now apparent. It requires one less transistor and one less control signal and is thus easier to manufacture. Further, because of the nonvolatile nature of the cell, the circuit of FIG. 6 remains programmed in the event that power is interrupted. The circuit of FIG. 7 must be reprogrammed using special software routines.

The invention has now been described with reference to several embodiments. Substitutions and alternative will now be apparent to persons of ordinary skill in the art. In particular, the doping level along the boundary of the floating gate adjacent the drain diffusion can be enhanced to increase the capacitive coupling between the drain and the floating gate. Alternatively, this boundary could slightly overlap the drain diffusion to increase this coupling. Further, if desired, it is possible to charge the floating gate utilizing the hot electron method by supplying a signal to the word line during the programming operation. Accordingly, it is not intended that the invention be limited except as provided by the appended claims.

What is claimed is:

1. An E²PROM memory cell formed in an array of cells, with the cell including first and second N+ regions formed along the surface of a P⁻ doped bulk semiconductor substrate, with the first and second regions oriented vertically and displaced from each other horizontally, with a polysilicon control electrode oriented horizontally and overlying the substrate, and with the region of the substrate disposed between the first and second diffused regions and underlying the control electrode forming a first channel region, with the first channel region including a drain area disposed adjacent to the first diffusion region and a source area disposed adjacent to the second diffusion region, and with the first N+ region, first channel region, control electrode, and second N+ region forming the drain, channel, gate, and source of a first MOS transistor, said memory cell comprising:

a control N+ region, displaced vertically from the first channel region, positioned between the first and second regions, and isolated therefrom; and a programmable polysilicon floating gate electrode having a first electrode region disposed only over the drain area of the first channel region and under the control electrode and having a second electrode region disposed over a second channel region and substantially all of said control diffusion region, with said second electrode region capacitively coupled to the first N+ region and bulk semiconductor substrate, with said second channel region displaced vertically from the second channel region and with said second electrode region, said second channel region, the first N+ region, and with said control region, said second channel region, and said first diffusion region forming a second MOS transistor.

2. An E²PROM memory, formed on a semiconductor substrate of a first conductivity type having a major surface, said memory comprising:

an array of MxN E²PROM cells organized into M rows and N columns;

a set of N+1 bit line diffusions of a second conductivity type formed along the major surface of the substrate, oriented in a substantially vertical direction, and forming N adjacent pairs of bit line diffusions, with a first bit line diffusion in a given adjacent pair of bit line diffusions forming a drain diffusion for a given cell and a second bit line diffusion in said given pair forming a source diffusion for said given cell;

a set of M polysilicon word line conductors disposed over the major surface of the substrate, separated therefrom by a layer of silicon dioxide, and oriented in a substantially horizontal direction, with each of said word line conductors associated with a given row in said array and with the area disposed below the word line conductor associated with a given cell being a first channel region of said given cell, with the first channel region including a drain area adjacent to said drain diffusion and a source area adjacent to said source region of said given cell;

a set of MxN control diffusion regions of a second conductivity type, with each control diffusion included in a given one of said memory cells, geometrically isolated from said pair of bit line diffusions, and spaced apart from said first channel region in said given cell; and a set of MxN polysilicon floating gates, with each floating gate included in a given one of the cells in said array, with each floating gate including a first region disposed below the word line conductor associated with given cell and disposed only over said drain area of said first channel region of said given cell, and with each floating gate including a second region adapted to be capacitively coupled to the drain diffusion of the given cell, disposed substantially over said control diffusion included in said given cell to form a floating gate/control region capacitance, and disposed over a second channel region of the major surface, included in said given cell, with said included second channel region connecting said drain diffusion and control diffusion region of said given cell.

3. The invention of claim 2 wherein said second channel region is adapted to be inverted when the drain diffusion of said given cell is charged to a programming voltage thereby electrically coupling said included control diffusion to the associated drain diffusion, charging said included drain diffusion to a control voltage substantially equal to said programming voltage, and coupling said control voltage to said included floating gate via said floating gate/control region capacitance.

4. The invention of claim 2 or 3 wherein said included floating gate partially overlies the associated drain diffusion to electrically couple said included floating gate to said associated drain diffusion.

5. The invention of claim 2 or 3 wherein said included floating gate includes an enhanced region of the second type conductivity disposed near said associated drain diffusion to electrically couple said included floating gate to said associated drain diffusion.

6. A circuit element, formed on a major face of a P− doped silicon substrate, that functions as an NMOS transistor having a programmable threshold voltage, said circuit element comprising:

spaced apart source and drain N+ diffusion regions formed on the major surface;

a polysilicon control electrode disposed over the major surface, with the area of the major surface disposed below said control electrode forming a first channel region connecting said source and drain diffusion regions, and with said source and drain diffusion regions, said first channel region, and said control electrode forming a first NMOS transistor;

a control N+ diffusion region formed on the major surface and spaced apart from said source and drain regions and said first channel region;

a polysilicon floating gate electrode having a first region disposed below said control electrode and over only a portion of said first channel region, and having a second region substantially overlying said control region and strongly capacitively coupled thereto and with a region of the major surface disposed between said drain region and said control region and below said second region forming a second channel region, with said drain region, said control region, said second channel region, and said second region forming a second MOS transistor.

7. The invention of claim 6 wherein a first boundary of said floating gate is adjacent to a first boundary of said drain region to capacitively couple said floating gate region said drain region.

* * * * *